United States Patent
Nagaya et al.

(10) Patent No.: US 9,922,906 B2
(45) Date of Patent: Mar. 20, 2018

(54) ELECTRONIC DEVICE AND MANUFACTURING METHOD OF ELECTRONIC DEVICE

(71) Applicant: DENSO CORPORATION, Kariya-city, Aichi-pref. (JP)

(72) Inventors: Toshihiro Nagaya, Okazaki (JP); Nobuhiko Okada, Obu (JP); Hiromasa Hayashi, Obu (JP)

(73) Assignee: DENSO CORPORATION, Kariya (JP)

( * ) Notice: Subject to any disclaimer, the term of this patent is extended or adjusted under 35 U.S.C. 154(b) by 306 days.

(21) Appl. No.: 14/283,446

(22) Filed: May 21, 2014

(65) Prior Publication Data
US 2014/0347838 A1 Nov. 27, 2014

(30) Foreign Application Priority Data
May 23, 2013 (JP) .................................. 2013-108804

(51) Int. Cl.
*H01R 9/00* (2006.01)
*H05K 1/11* (2006.01)
(Continued)

(52) U.S. Cl.
CPC .. *H01L 23/49524* (2013.01); *H01L 23/49548* (2013.01); *H01L 23/49562* (2013.01);
(Continued)

(58) Field of Classification Search
CPC ...................... H01L 2224/40139; H01L 24/36; H01L 24/40
(Continued)

(56) References Cited

U.S. PATENT DOCUMENTS 6,313,402 B1 * 11/2001 Schreiber .............. H01L 21/568
174/527
6,521,982 B1 * 2/2003 Crowley ........... H01L 23/49513
257/139

(Continued)

FOREIGN PATENT DOCUMENTS

JP 2008-205100 A 9/2008
JP 2009-238859 A 10/2009
(Continued)

OTHER PUBLICATIONS

Office Action dated Apr. 13, 2015 issued in corresponding JP patent application No. 2013-108804 (and English translation).

*Primary Examiner* — William H Mayo, III
*Assistant Examiner* — Rhadames J Alonzo Miller
(74) *Attorney, Agent, or Firm* — Posz Law Group, PLC

(57) ABSTRACT

An electronic device includes first to third terminals and a clip. The clip includes first to third joint portions and a connection portion. The first to third joint portions correspond to and are bonded to the first to third terminals, respectively. The connection portion connects the first to third joint portions. One terminal in the first to third terminals has a depressed portion depressed to one side in a predetermined direction to store a conductive bonding material. A variation in positions of the first to third terminals in the predetermined direction is absorbed by deformation of the conductive bonding material when one joint portion in the first to third joint portions corresponding to the one terminal is bonded to the one terminal through the conductive bonding material.

18 Claims, 12 Drawing Sheets

(51) Int. Cl.
*H01L 23/495* (2006.01)
*H01L 23/00* (2006.01)

(52) U.S. Cl.
CPC ........ *H01L 23/49575* (2013.01); *H01L 24/37* (2013.01); *H01L 24/40* (2013.01); *H01L 2224/371* (2013.01); *H01L 2224/37124* (2013.01); *H01L 2224/37147* (2013.01); *H01L 2224/40095* (2013.01); *H01L 2224/40137* (2013.01); *H01L 2224/40139* (2013.01); *H01L 2224/40245* (2013.01); *H01L 2224/8385* (2013.01); *H01L 2224/8485* (2013.01); *H01L 2224/84801* (2013.01); *H01L 2924/1305* (2013.01); *H01L 2924/181* (2013.01); *Y10T 29/49121* (2015.01)

(58) Field of Classification Search
USPC ............ 361/783; 29/827; 174/261; 257/666, 257/674
See application file for complete search history.

(56) References Cited

U.S. PATENT DOCUMENTS

| | | | | |
|---|---|---|---|---|
| 6,593,527 | B1 * | 7/2003 | Brandenburg | H01L 23/492 |
| | | | | 174/535 |
| 7,274,092 | B2 * | 9/2007 | Otremba | H01L 23/49524 |
| | | | | 257/672 |
| 7,839,003 | B2 * | 11/2010 | Hamada | H01L 23/49524 |
| | | | | 257/666 |
| 2004/0155322 | A1 * | 8/2004 | Cho | H01L 23/3128 |
| | | | | 257/676 |
| 2007/0138624 | A1 * | 6/2007 | Sudo | H01L 23/3121 |
| | | | | 257/706 |
| 2008/0012045 | A1 * | 1/2008 | Muto | H01L 21/565 |
| | | | | 257/177 |
| 2013/0154073 | A1 * | 6/2013 | Massie | H01L 23/49524 |
| | | | | 257/676 |
| 2013/0181228 | A1 * | 7/2013 | Usui | H01L 23/4334 |
| | | | | 257/77 |
| 2013/0221532 | A1 * | 8/2013 | Fujita | H01L 24/34 |
| | | | | 257/773 |
| 2013/0270688 | A1 * | 10/2013 | Ota | H01L 23/36 |
| | | | | 257/690 |
| 2013/0307129 | A1 * | 11/2013 | Fujita | H01L 23/4952 |
| | | | | 257/666 |
| 2013/0313696 | A1 * | 11/2013 | Hsieh | H01L 23/34 |
| | | | | 257/675 |
| 2014/0284777 | A1 * | 9/2014 | Otremba | H01L 23/49513 |
| | | | | 257/666 |

FOREIGN PATENT DOCUMENTS

| | | |
|---|---|---|
| JP | 2011-049244 A | 3/2011 |
| JP | 2012-235010 A | 11/2012 |
| JP | 2013-016623 A | 1/2013 |

* cited by examiner

ELECTRONIC DEVICE AND MANUFACTURING METHOD OF ELECTRONIC DEVICE

CROSS REFERENCE TO RELATED APPLICATIONS

The present application is based on and claims priority to Japanese Patent Application No. 2013-108804 filed on May 23, 2013, the contents of which are incorporated in their entirety herein by reference.

TECHNICAL FIELD

The present disclosure relates to an electronic device and a manufacturing method of an electronic device.

BACKGROUND

JP-A-2012-235010 discloses an electronic device that includes a clip. The clip includes three joint portions respectively corresponding to three terminals disposed on a substrate and a bridge portion connecting the three joint portions.

In the semiconductor device, the three joint portions of the clip are respectively bonded to the three terminals by soldering in a state where the three joint portions are disposed on upper side of the corresponding terminals. Accordingly, the three terminals are electrically connected to each other with the clip.

However, when heights of the three terminals vary, a clearance may be generated between one of the three joint portions and the corresponding terminal, and the joint portion and the terminal may fail to connect.

SUMMARY

An object of the present disclosure is to provide an electronic device in which three terminals can be certainly connected to each other.

An electronic device according to an aspect of the present disclosure includes first to third terminals and a clip. The clip includes first to third joint portions and a connection portion. The first to third joint portions correspond to and are bonded to the first to third terminals, respectively. The connection portion connects the first to third joint portions. One terminal in the first to third terminals has a depressed portion depressed to one side in a predetermined direction to store a conductive bonding material. A variation in positions of the first to third terminals in the predetermined direction is absorbed by deformation of the conductive bonding material when one joint portion in the first to third joint portions corresponding to the one terminal is bonded to the one terminal through the conductive bonding material.

The electronic device can absorb the variation in the positions of the first to third terminals in the predetermined direction by deformation of the conductive bonding material when the one joint portion is bonded to the one terminal through the conductive bonding material. Thus, the first to third terminals can be certainly connected to each other with the clip.

A manufacturing method of an electronic device according another aspect of the present disclosure includes preparing first to third terminals, preparing a clip including first to third joint portions and a connection portion, and bonding the first to third joint portions to the first to third terminals, respectively. One terminal in the first to third terminals has a depressed portion depressed to one side in a predetermined direction. The first to third joint portions respectively correspond to the first to third terminals. The connection portion connects the first to third joint portions. The bonding includes storing conductive bonding material in the depressed portion in the one terminal, disposing one joint portion in the first to third joint portions corresponding to the one terminal in the depressed portion in the one terminal, and absorbing a variation in positions of the first to third terminals in the predetermined direction by deformation of the conductive bonding material.

Because the manufacturing method can absorb the variation in the positions of the first to third terminals in the predetermined direction by deformation of the conductive bonding material, the first to third terminals can be certainly connected to each other with the clip.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

First Embodiment

A semiconductor device 1 according to a first embodiment of the present disclosure will be described with reference to FIG. 1 to FIG. 3. The semiconductor device 1 is applied with an electronic device according to the present disclosure.

Figure 1:
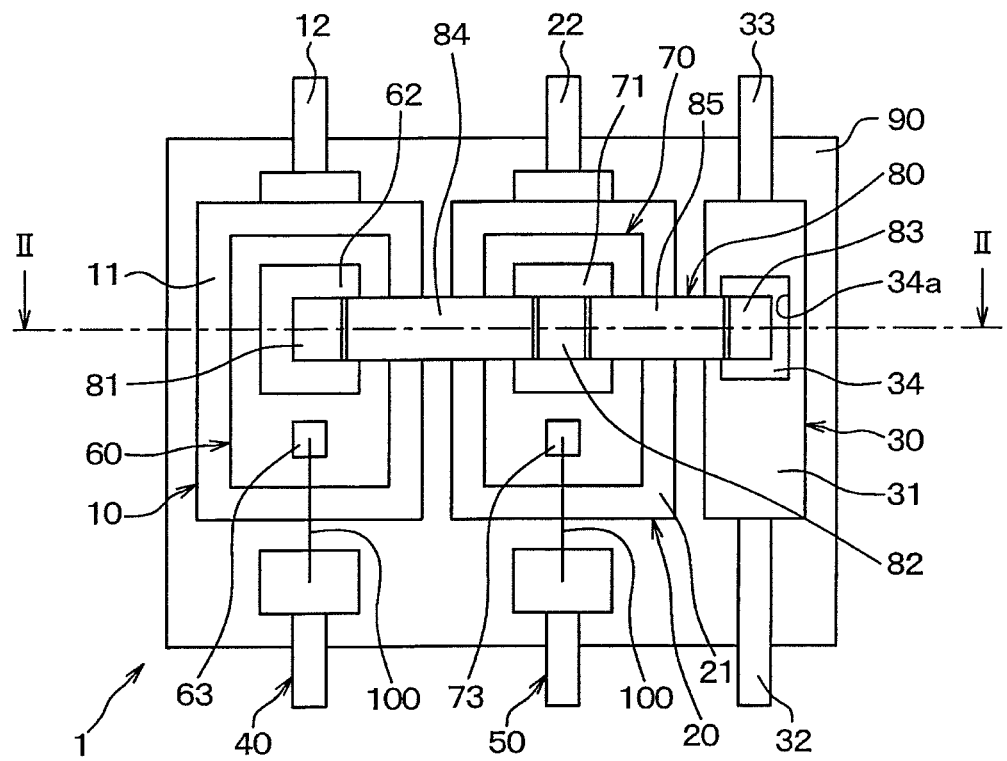
FIG. 1 is a top view of a semiconductor device according to a first embodiment of the present disclosure.
Figure 2:
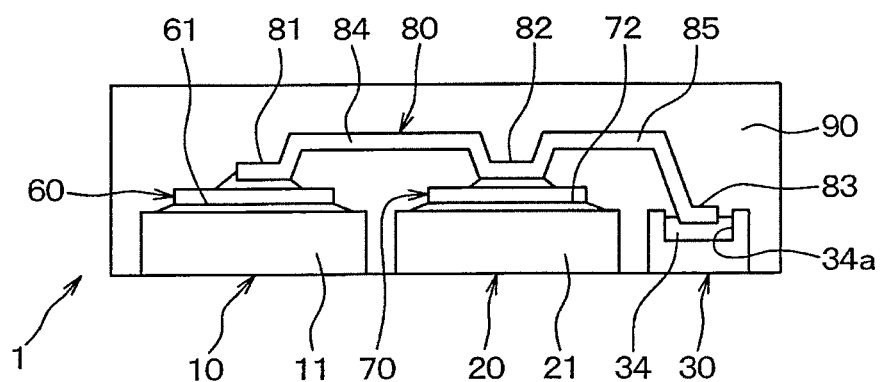
FIG. 2 is a cross-sectional view of the semiconductor device taken along line II-II in FIG. 1.
Figure 3:
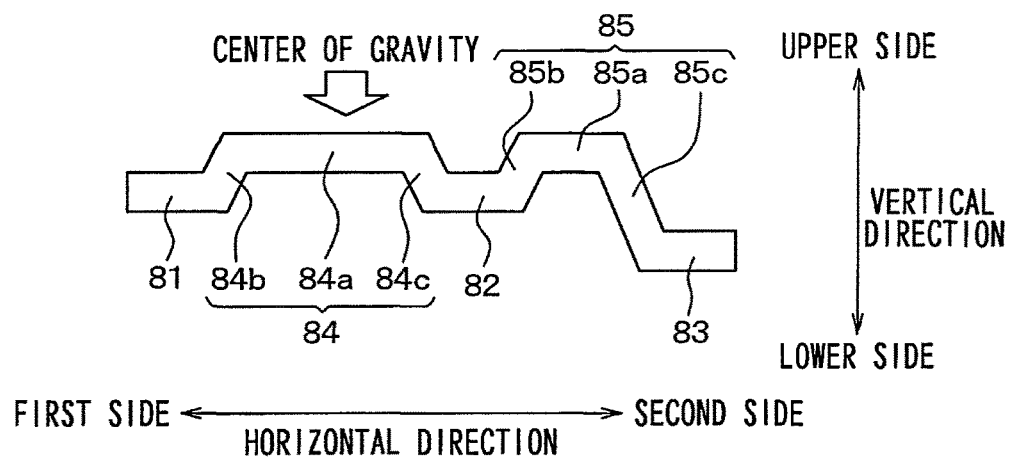
FIG. 3 is a side view of a clip in the semiconductor device in FIG. 1.

As illustrated in FIG. 1 and FIG. 2, the semiconductor device 1 includes islands 10, 20, 30, terminals 40, 50, semiconductor switching elements 60, 70, a clip 80, and a sealing resin member 90. FIG. 1 is a top view of the semiconductor device 1 inside a visible outline of the sealing resin member 90. In FIG. 2, a hatching indicating a cross section is omitted for the purpose of making clear of the drawing.

The island 10 includes an island body 11 and a terminal portion 12. The island body 11 has a plate shape. A lower surface of the island body 11 is exposed outside the sealing resin member 90. The island body 11 can work as a heat sink that releases heat generated from the semiconductor switching element 60 to outside the sealing resin member 90. The terminal portion 12 protrudes from the island body 11. An end portion of the terminal portion 12 is exposed outside the sealing resin member 90. The island body 11 is connected to a power supply through the terminal portion 12.

The island 20 includes an island body 21 and a terminal portion 22 in a manner similar to the island 10. The island body 21 in the island 20 corresponds to the island body 11 in the island 10. The terminal portion 22 in the island 20 corresponds to the terminal portion 12 in the island 10. The island body 21 can work as a heat sink that releases heat generated from the semiconductor switching element 70 to outside the sealing resin member 90. The island body 21 is connected to a ground through the terminal portion 22.

The island 30 includes an island body 31 and terminal portions 32, 33. The island body 31 has a thin plate shape. In an upper surface of the island body 31, a depressed portion 34 that is depressed downward in a height direction (i.e., vertical direction) is provided. The depressed portion 34 has sidewalls formed in parallel in the height direction. In the depressed portion 34, conductive bonding material is stored.

The terminal portion 32 protrudes from the island body 31. The terminal portion 32 is disposed in parallel with the terminal portion 22. The terminal portion 33 is disposed on an opposite side of the island body 31 from the terminal portion 32. The terminal portion 33 protrudes from the island body 31 in an opposite direction with respect to the terminal portion 32.

The islands 10, 20, 30 are arranged in a line in a horizontal direction that is perpendicular to the height direction. A direction in which the terminal portions 12, 22 protrude is perpendicular to a direction in which the islands 10, 20, 30 are arranged and is perpendicular to the height direction. The islands 10, 20, 30 are made of conductive metal such as copper and aluminum.

The terminal 40 is disposed on an opposite side of the island body 11 in the island 10 from the terminal portion 12. An end portion of the terminal 40 protrudes in an opposite direction with respect to the end portion of the terminal portion 12.

The terminal 50 is disposed on an opposite side of the island body 21 in the island 20 from the terminal portion 22. An end portion of the terminal 50 protrudes in an opposite direction with respect to the end portion of the terminal portion 22.

The semiconductor switching element 60 is disposed on an upper side of the island body 11 in the height direction. The semiconductor switching element 60 is formed into a thin plate shape. A lower surface of the semiconductor switching element 60 can work as an input terminal 61. The input terminal 61 of the semiconductor switching element 60 is bonded to the island body 11 with conductive bonding material. In the present embodiment, the conductive bonding material may include a solder paste or a conductive adhesive.

On an upper surface of the semiconductor switching element 60, an output terminal 62 and a control terminal 63 are disposed. The control terminal 63 receives a control signal for controlling a resistance value between the input terminal 61 and the output terminal 62. Between the control terminal 63 and the terminal 40, a wiring 100 is connected.

The semiconductor switching element 70 is disposed on an upper side of the island body 21 in the height direction. The semiconductor switching element 70 is formed into a thin plate shape. A lower surface of the semiconductor switching element 70 can work as an output terminal 72. The output terminal 72 of the semiconductor switching element 70 is bonded to the island body 21 with the conductive bonding material. On an upper surface of the semiconductor switching element 70, an input terminal 71 and a control terminal 73 are disposed. The control terminal 73 receives a control signal for controlling a resistance value between the input terminal 71 and the output terminal 72. Between the control terminal 73 and the terminal 50, a wiring 100 is connected.

As the semiconductor switching elements 60, 70 in the present embodiment, for example, transistors such as insulated gate bipolar transistors and field effect transistors can be used.

The clip 80 is a connection member that connects the output terminals 62 of the semiconductor switching element 60, the input terminal 71 of the semiconductor switching element 70 and the island 30. As illustrated in FIG. 3, the clip 80 includes a joint portions 81, 82, 83 and bridge portions 84, 85. The bridge portions 84, 85 can work as connection portions. The joint portion 81 is disposed to a first side of the joint portion 82 in the horizontal direction. The joint portion 83 is disposed to a second side of the joint portion 82 in the horizontal direction. The second side is an opposite side from the first side. The joint portion 83 is located below the joint portions 81, 82 in the height direction. The joint portion 81 corresponds to the output terminal 62 of the semiconductor switching element 60, and the joint portion 82 corresponds to the input terminal 71 of the semiconductor switching element 70. The joint portion 83 corresponds to the island 30.

The bridge portion 84 connects the joint portions 81, 82. The bridge portion 84 includes a horizontal portion 84a and inclined portions 84b, 84c. The horizontal portion 84a is disposed between the joint portions 81, 82 and extends in the horizontal direction. The inclined portion 84b is disposed between the joint portion 81 and the horizontal portion 84a and is inclined with respect to the horizontal portion 84a. The inclined portion 84c is disposed between the joint portion 82 and the horizontal portion 84a and is inclined with respect to the horizontal portion 84a.

The bridge portion 85 connects the joint portions 82, 83. The bridge portion 85 includes a horizontal portion 85a and inclined portions 85b, 85c. The horizontal portion 85a is disposed between the joint portions 82, 83 and extends in the horizontal direction. The inclined portion 85b is disposed between the joint portion 82 and the horizontal portion 85a and is inclined with respect to the horizontal portion 85a. The inclined portion 85c is disposed between the joint portion 83 and the horizontal portion 85a and is inclined with respect to the horizontal portion 85a.

The clip 80 according to the present embodiment has a center of gravity at a position closer to the joint portion 81 than to the joint portion 83. In other words, the center of gravity is positioned between the joint portions 81, 82 (see FIG. 3). The clip 80 is made of conductive metal such as aluminum and copper.

Figure 4:
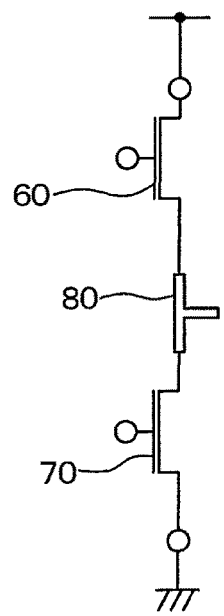
FIG. 4 is a diagram illustrating a circuit configuration of the semiconductor device according to the first embodiment.

The islands 10, 20, 30, the terminals 40, 50, the semiconductor switching elements 60, 70, and the clip 80 form a half bridge 200 (see FIG. 4). In the half bridge 200, the semiconductor switching elements 60, 70 are connected in series between the power supply and the ground.

The sealing resin member 90 is made of resin having electrical insulation property. The sealing resin member 90 seals the islands 10, 20, 30, the terminals 40, 50, the semiconductor switching elements 60, 70, and the clip 80.

Figure 5:
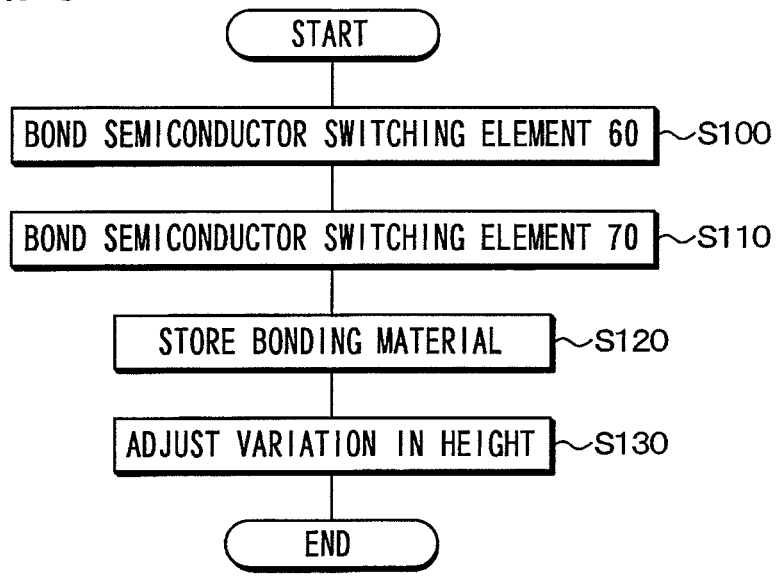
FIG. 5 is a flowchart illustrating a manufacturing process of the semiconductor device according to the first embodiment.

A manufacturing method of the semiconductor device 1 according to the present embodiment will be described with reference to FIG. 5.

Firstly, the island body 11 and the semiconductor switching element 60 are bonded by a reflow method. Specifically, the conductive bonding material is applied to the upper surface of the island body 11 in the island 10, and the semiconductor switching element 60 is mounted on an upper side of the conductive bonding material. Next, the conductive bonding material is heated to melt, and then the conductive bonding material is cooled to solidify. Accordingly, the island body 11 and the semiconductor switching element 60 are bonded with the conductive bonding material (S100).

Next, in a manner similar to the process at S100, the island body 21 and the semiconductor switching element 70 are bonded with the conductive bonding material by the reflow method.

In this way, the island 10 and the semiconductor switching element 60 are bonded to each other and the island 20 and the semiconductor switching element 70 are bonded to each other.

In the next process, the semiconductor switching element 60, the semiconductor switching element 70 and the island 30 are joined with the clip 80.

Specifically, the semiconductor switching element 60, the semiconductor switching element 70, and the island 30 are arranged in a line. At this time, the island 30 is disposed in such a manner that the depressed portion 34 faces upward. Next, the output terminal 62 of the semiconductor switching element 60 and the input terminal 71 of the semiconductor switching element 70 are applied with the conductive bonding material. In addition, the conductive bonding material is applied inside the depressed portion 34 of the island 30 so that the conductive bonding material is stored in the depressed portion 34 (S120).

In this state, the joint portion 81 of the clip 80 is mounted on an upper side of the conductive bonding material applied to the output terminal 62 of the semiconductor switching element 60. The joint portion 82 of the clip 80 is mounted on an upper side of the conductive bonding member applied to the input terminal 71 of the semiconductor switching element 70. The joint portion 83 of the clip 80 is mounted on an upper side of the conductive bonding material inside the depressed portion 34 of the island 30. At this time, the joint portion 83 of the clip 80 is disposed away from a depressed-portion forming part 34a that defines the depressed portion 34.

Next, the conductive bonding material applied to the output terminal 62 of the semiconductor switching element 60, the conductive bonding material applied to the input terminal 71 of the semiconductor switching element 70, and the conductive bonding material inside the depressed portion 34 of the island 30 are heated to melt.

Accordingly, the conductive bonding material inside the depressed portion 34 of the island 30 deforms due to the weight of the clip 80, and the height of the joint portion 83 of the clip 80 is adjusted. After that, the joint portion 83 of the clip 60 is kept away from the depressed-portion forming part 34a of the island 30 (see FIG. 6). In other words, the joint portion 83 of the clip 80 is kept away from a side part and a bottom part of the depressed portion 34.

Accordingly, the variation in heights of the output terminal 62 of the semiconductor switching element 60, the input terminal 71 of the semiconductor switching element 70, and the island 30 can be absorbed (S130). After that, the conductive bonding material is cooled to solidify in a state where the joint portion 83 of the clip 80 is away from the depressed-portion forming part 34a.

Accordingly, the output terminal 62 of the semiconductor switching element 60 and the joint portion 81 of the clip 80 are bonded to each other. The input terminal 71 of the semiconductor switching element 70 and the joint portion 82 of the clip 80 are bonded to each other. The joint portion 83 of the clip 80 and the island 30 are bonded to each other.

After that, the islands 10, 20, 30, the terminals 40, 50, the semiconductor switching elements 60, 70, and the clip 80 are sealed with sealing resin to form the sealing resin member 90. Accordingly, the semiconductor device 1 is completed.

According to the present embodiment, the semiconductor device 1 includes the semiconductor switching elements 60, 70, the island 30, and the clip 80. The clip 80 includes the joint portion 81 corresponding to the output terminal 62 of the semiconductor switching element 60, the joint portion 82 corresponding to the input terminal 71 of the semiconductor switching element 70, and the joint portion 83 corresponding to the island 30. The clip 80 further includes the bridge portions 84, 84 connecting the joint portions 81, 82, 83 to each other. The island 30 has the depressed portion 34 depressed downward in the height direction to store the conductive bonding material. Inside the depressed portion 34, the joint portion 83 corresponding to the island 30 is bonded to the island 30 through the conductive bonding material. Accordingly, the variation in heights of the output terminal 62 of the semiconductor switching element 60, the input terminal 71 of the semiconductor switching element 70, and the island 30 is absorbed by the deformation of the conductive bonding material inside the depressed portion 34. Accordingly, the output terminal 62 of the semiconductor switching element 60, the input terminal 71 of the semiconductor switching element 70, and the island 30 can be certainly connected to each other with the clip 80.

In the present embodiment, as described above, the center of gravity of the clip 80 is located between the joint portions 81, 82.

If the center of gravity of the clip 80 is located between the joint portions 82, 83, the following problem occurs. When the joint portions 81, 82, 83 of the clip 80 are respectively disposed on the output terminal 62 of the semiconductor switching element 60, the input terminal 71 of the semiconductor switching element 70, and the island 30, the joint portion 83 of the clip 80 is likely to come in contact with the bottom part of the depressed portion 34 of the island 30 and the joint portion 81 of the clip 80 is likely to be away from the output terminal 62 of the semiconductor switching element 60 due to the weight of the clip 80. If the joint portion 81 of the clip 80 is away from the output terminal 62 of the semiconductor switching element 60, the joint portion 81 of the clip 80 and the output terminal 62 and the semiconductor switching element 60 may fail to be connected with each other.

Thus, as described above, the clip 80 is designed such that the center of gravity is located between the joint portions 81, 82. Thus, due to the weight of the clip 80, the joint portion 81 of the clip 80 can come close to the output terminal 62 of the semiconductor switching element 60. Accordingly, the joint portion 81 of the clip 80 and the output terminal 62 of the semiconductor switching element 60 can be certainly connected to each other.

Figure 6:
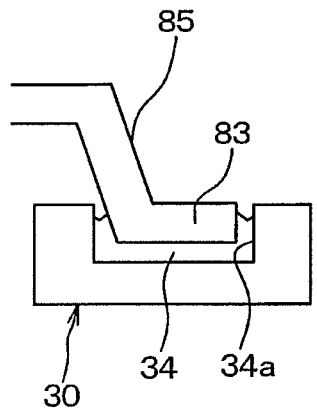
FIG. 6 is an enlarged view of a joint portion of a clip and an island.

In the present embodiment, during the manufacturing process, the joint portion 83 of the clip 80 is kept away from the depressed-portion forming part 34a when the variation in heights of the output terminal 62 of the semiconductor switching element 60, the input terminal 71 of the semiconductor switching element 70, and the island 30 is absorbed (see FIG. 6).

Figure 7:
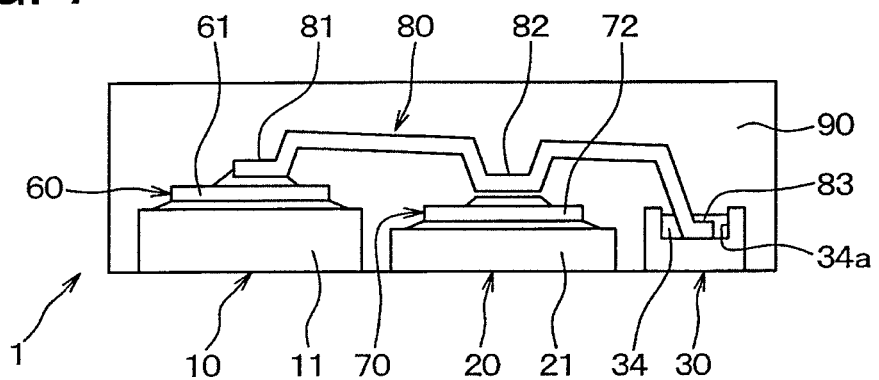
FIG. 7 is a cross-sectional view of a semiconductor device according to a comparative example.

If the joint portion 82 of the clip 80 is in contact with the bottom part of the depressed portion 34 of the island 30 as illustrated in FIG. 7, for example, the joint portion 82 of the clip 80 may be away from the input terminal 71 of the semiconductor switching element 70, and the joint portion 82 of the clip 80 may fail to be connected to the each other.

On other hand, in the present embodiment, the joint portion 83 of the clip 80 is kept away from the depressed-portion forming part 34a of the island 30. Thus, the joint portion 82 of the clip 80 can come close to the input terminal 71 of the semiconductor switching element 70. Accordingly, the joint portion 82 of the clip 80 and the input terminal 71 of the semiconductor switching element 70 can be certainly connected to each other with the conductive bonding material.

In the present embodiments, the clip 80 is used for connecting first to third terminals (i.e., the output terminal 62 of the semiconductor switching element 60, the input terminal 71 of the semiconductor switching element 70, and the island 30) to each other.

As a comparative example, it is possible to connect the first to third terminals to each other by wire bonding. However, in practice, because the number of wires capable of being used is limited, contact areas between the wires and the terminals are limited. Thus, resistance values between the wires and the terminals increase and the loss of power transferred between the first to third terminals increases.

As another comparative example, it is possible to connect the first and the second terminals with a first clip and to connect the second and third terminals with a second clip. In this case, not only the number of components increases but also it is required to secure a large connection area in the second terminal for connecting the first and second clips. Thus, the dimension of the semiconductor device 1 may increase.

On the other hand, in the present embodiment, the first to third terminals are connected to each other with the one clip 80. Thus, the increase of the power loss and the increase of the semiconductor device 1 can be restricted.

In the first embodiment, the sidewalls of the depressed portion 34 are formed in parallel with the height direction. However, the shape of the depressed portion 34 may be modified, for example, as follows.

Figure 8:
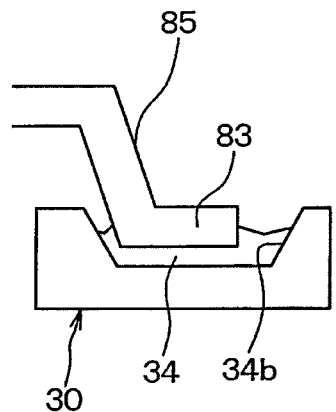
FIG. 8 is an enlarged view of a joint portion of a clip and an island according to a first modification of the first embodiment.

In a first modification of the first embodiment, as illustrated in FIG. 8, four sidewalls 34b of the depressed portion 34 are inclined from the height direction in such a manner that an opening area of the depressed portion 34 in the horizontal direction increases upward in the height direction. Accordingly, when the joint portion 83 of the clip 80 is disposed in the depressed portion 34 of the island 30, an operator can easily confirm whether the joint portion 83 is away from the depressed-portion forming part 34a.

Figure 9:
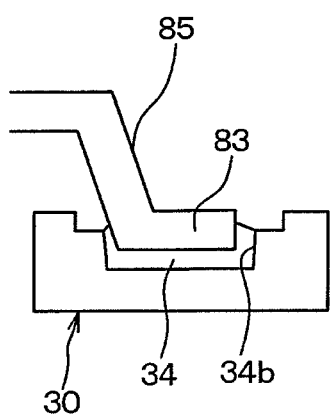
FIG. 9 is an enlarged view of a joint portion of a clip and an island according to a second modification of the first embodiment.

In a second modification of the first embodiment, as illustrated in FIG. 9, each of four sidewalls 34b of the depressed portion 34 is formed into a stepped shape, and an opening area at an upper side of the depressed portion 34 is larger than an opening area at a lower side of the depressed portion 34. Thus, in a manner similar to the first modification, the operator can easily confirm whether the joint portion 83 is away from the depressed-portion forming part 34a.

Figure 10:
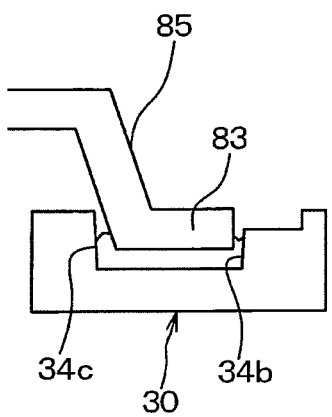
FIG. 10 is an enlarged view of a joint portion of a clip and an island according to a third modification of the first embodiment.
Figure 11:
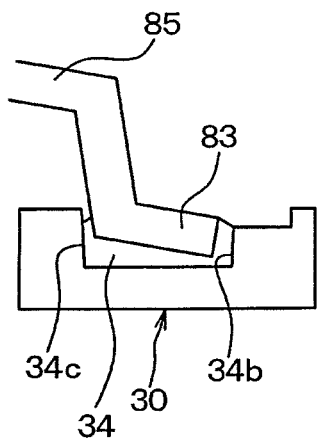
FIG. 11 is an enlarged view of the joint portion of the clip and the island according to the third modification of the first embodiment.
Figure 12:
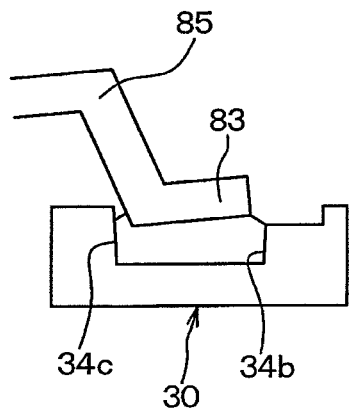
FIG. 12 is an enlarged view of the joint portion of the clip and the island according to the third modification of the first embodiment.

In a third modification of the first embodiment, as illustrated in FIG. 10, each of three sidewalls 34b of the depressed portion 34 other than a sidewall 34c close to the bridge portion 85 is formed into a stepped shape. Thus, in a manner similar to the first modification, an operator can easily confirm a state where the joint portion 83 is away from the depressed-portion forming part 34a (see FIG. 11 and FIG. 12).

Figure 13:
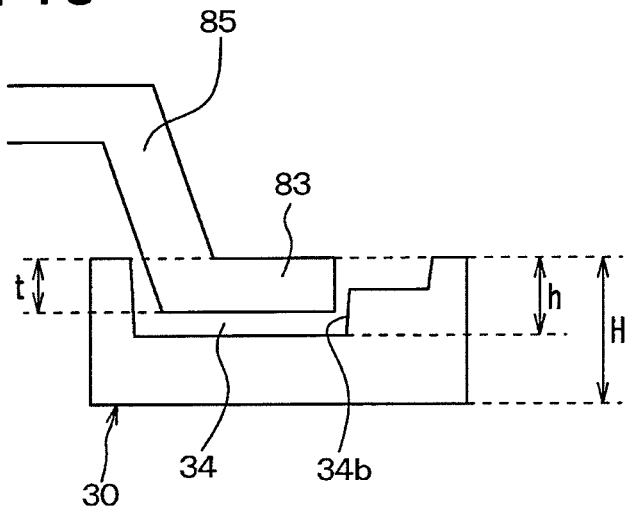
FIG. 13 is an enlarged view showing dimensions of the joint portion of the clip and the island according to the third modification of the first embodiment.

A dimension relationship of the depressed portion 34 of the island 30 and the joint portion 83 of the clip 80 according to the third modification is shown in FIG. 13. When the dimension of the island 30 in the height direction is expressed by H, the depth (the dimension in the height direction) of the depressed portion 34 is expressed by h, and the dimension of the joint portion 83 in the thickness directions expressed by t, a relationship of t≤h≤3H is satisfied.

Second Embodiment

Figure 14:
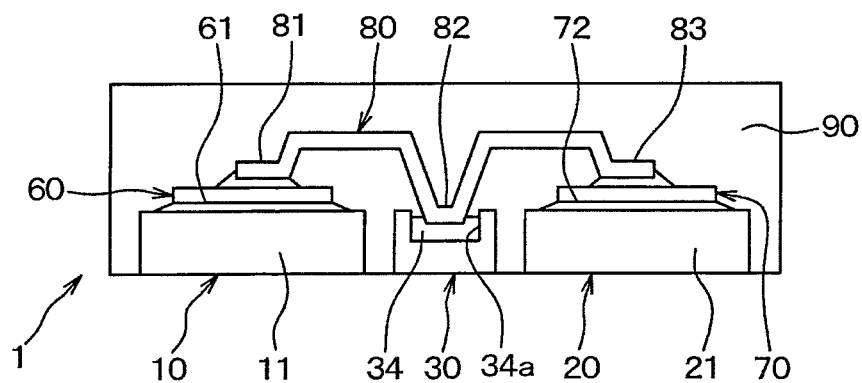
FIG. 14 is a cross-sectional view of a semiconductor device according to a second embodiment of the present disclosure.
Figure 15:
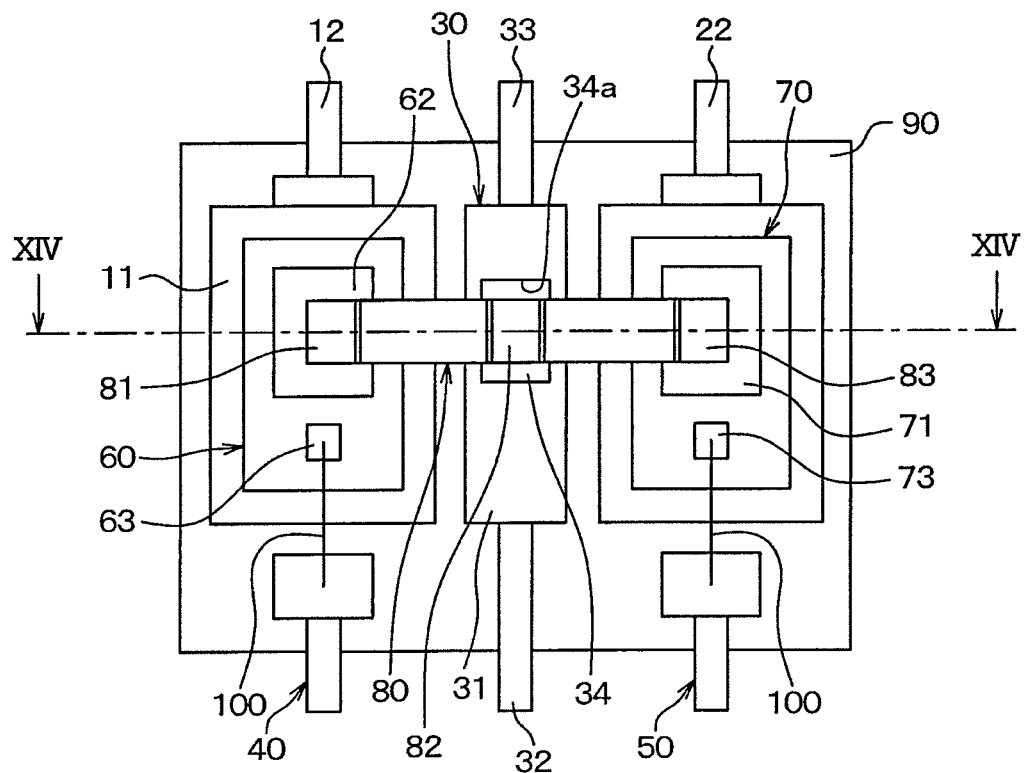
FIG. 15 is a top view of the semiconductor device according to the second embodiment.

A semiconductor device 1 according to a second embodiment of the present disclosure will be described with reference to FIG. 14 and FIG. 15. In the present embodiment, the joint portion 82 of the clip 80 and the island 30 are bonded to each other, and the joint portion 83 of the clip 80 is connected to the input terminal 71 of the semiconductor switching element 70. FIG. 15 is a top view of the semiconductor device 1 inside a visible outline of the sealing resin member 90. FIG. 14 is a cross-sectional view of the semiconductor device 1 taken along line XIV-XIV in FIG. 15. In FIG. 15, a hatching indicating a cross section is omitted for the purpose of making clear of the drawing.

Third Embodiment

Figure 16:
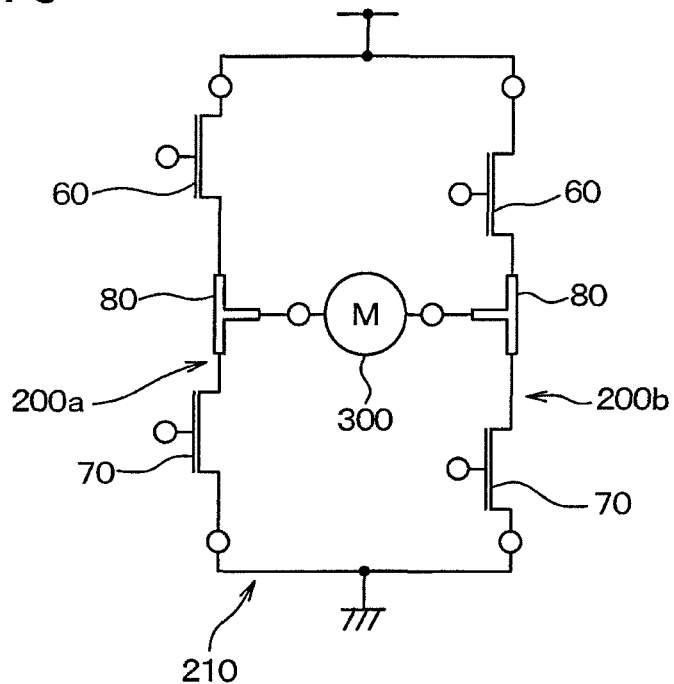
FIG. 16 is a circuit diagram of a semiconductor device according to a third embodiment of the present disclosure.
Figure 17:
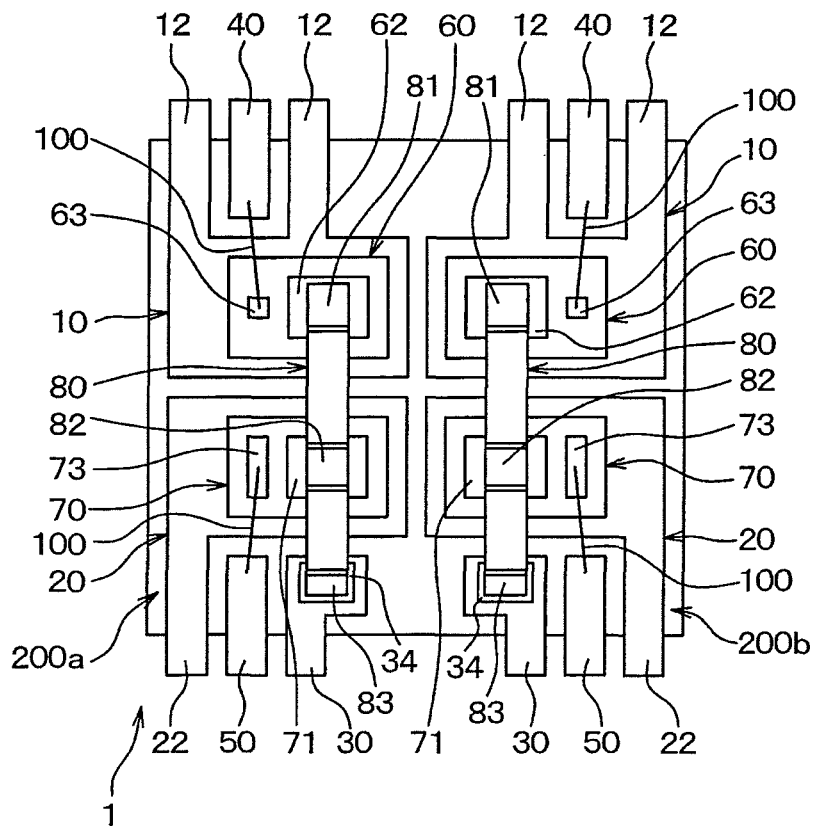
FIG. 17 is a top view of the semiconductor device according to the third embodiment.

A semiconductor device 1 according to a third embodiment of the present disclosure will be described with reference to FIG. 16 and FIG. 17. The semiconductor device 1 includes an H bridge 210 including four semiconductor switching elements and two clips 80.

The H bridge 210 controls a direct-current motor 300. The H bridge 210 includes half bridges 200a, 200b. FIG. 17 is a top view of the semiconductor device 1 inside a visible outline of the sealing resin member 90.

Each of the half bridges 200a, 200b has a configuration similar to the configuration of the half bridge 200 according to the first embodiment. In the present embodiment, the island 10 includes two terminal portions 12. Between the two terminal portions 12, a terminal 40 is disposed. In each of the half bridges 200a, 200b, the clip 80 is disposed inside in the width direction compared with the terminal 40.

Figure 18:
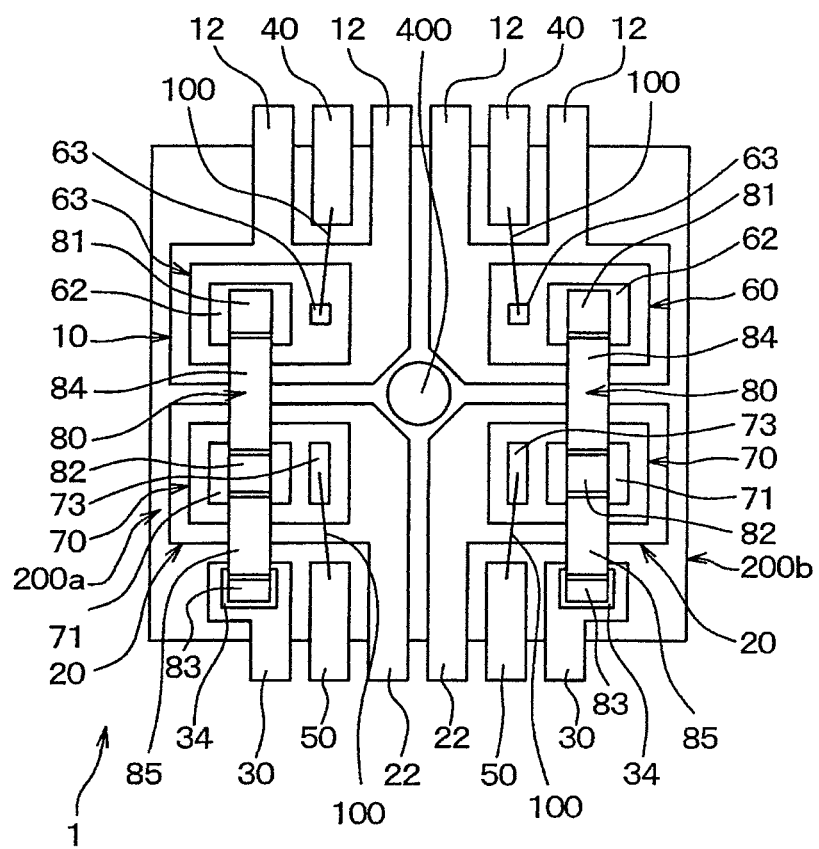
FIG. 18 is a top view of the semiconductor device according to a first modification of the third embodiment.

In a first modification of the third embodiment, as illustrated in FIG. 18, the clip 80 may be disposed outside in the width direction compared with the terminal 40. The semiconductor device 1 in FIG. 18 has a hole 400.

In the third embodiment, in each of the half bridges 200a, 200b, the bridge portions 84, 85 of the clip 80 extend in a direction perpendicular to the width direction. However, the clip 80 may be modified, for example, as follows.

Figure 19:
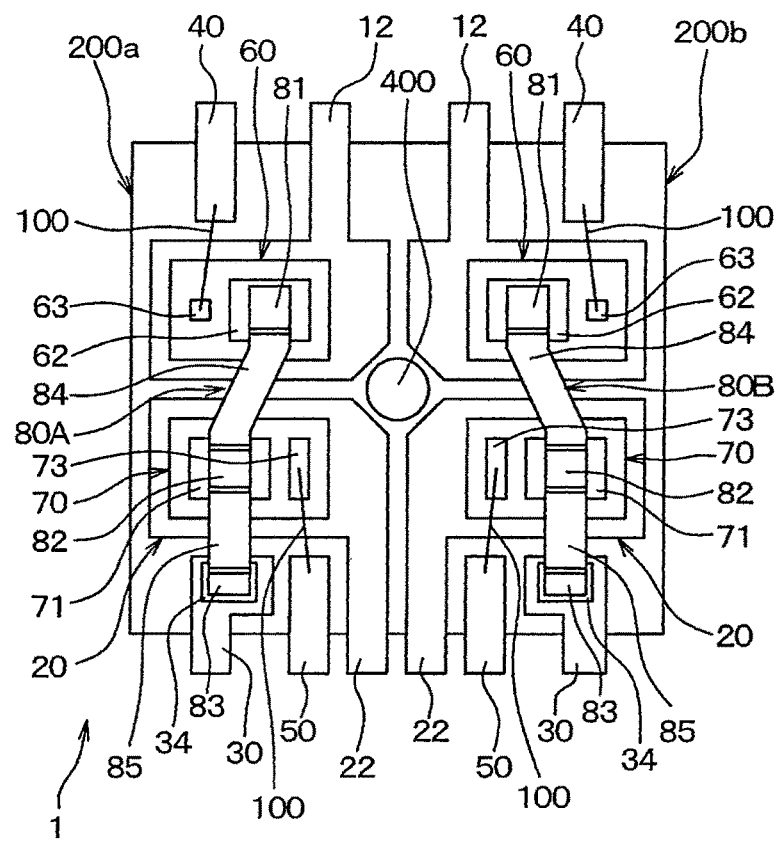
FIG. 19 is a top view of the semiconductor device according to a second modification of the third embodiment.
Figure 20:
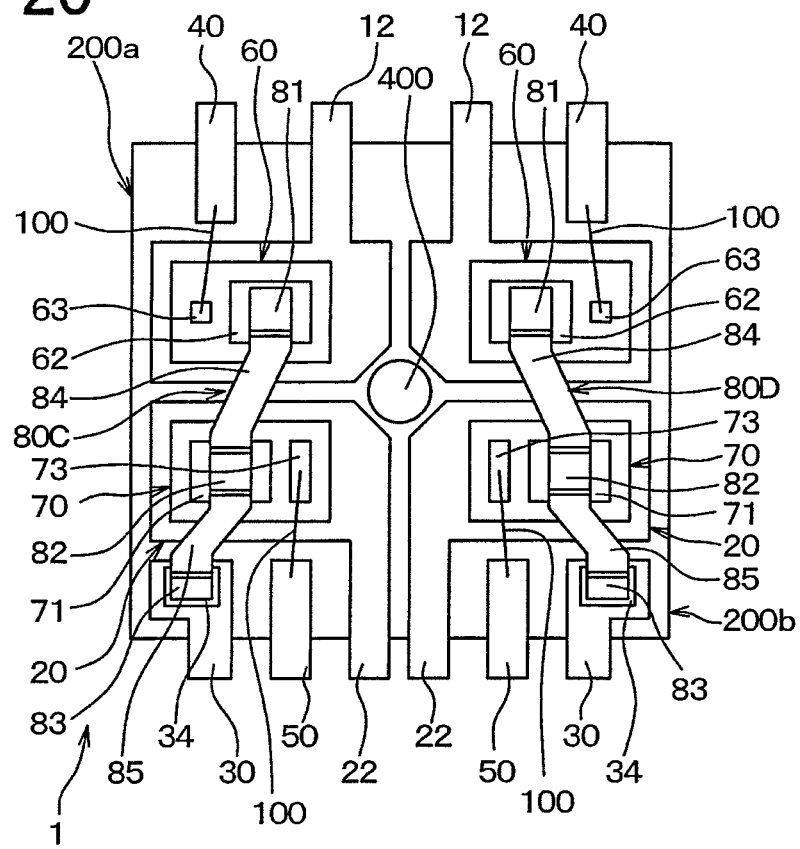
FIG. 20 is a top view of the semiconductor device according to a third modification of the third embodiment.

In a second modification of the third embodiment, as illustrated in FIG. 19, the half bridge 200a includes a clip 80A instead of the clip 80. In the clip 80A, the bridge portion 84 extends in a direction inclined toward the width direction. The half bridge 200b includes a clip 80B instead of the clip 80. The clip 80B extends in a direction inclined toward the width direction.

In a third modification of the third embodiment, the half bridge 200a includes a clip 80C instead of the clip 80. In the clip 80C, the bridge portions 84, 85 extend in directions inclined toward the width direction. The half bridge 200b includes a clip 80D instead of the clip 80. In the clip 80D, the bridge portions 84, 85 extend in directions inclined toward in the width direction.

Fourth Embodiment

Figure 21:
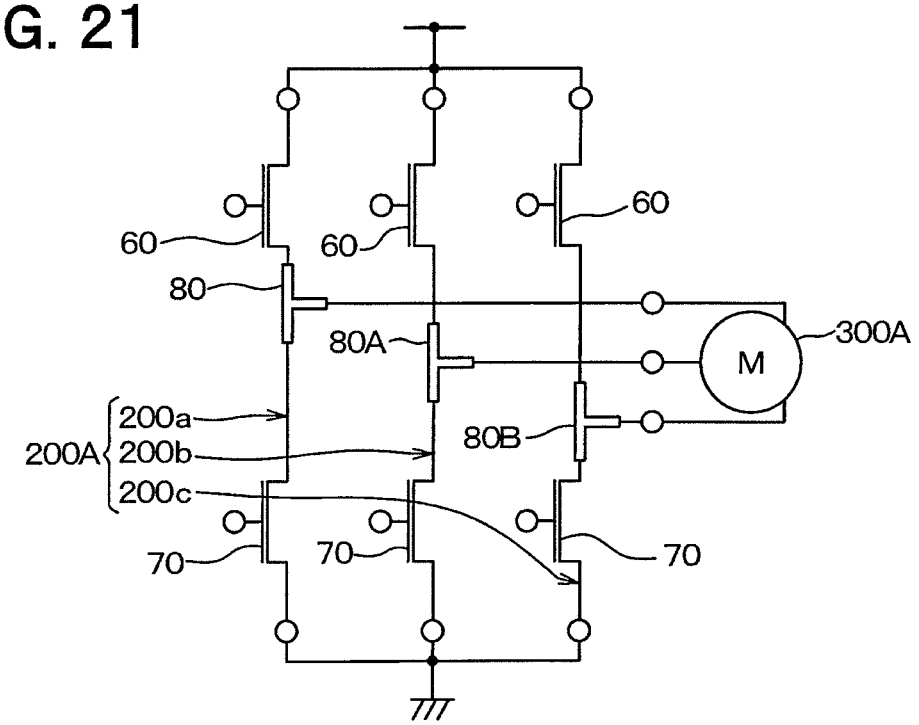
FIG. 21 is a circuit diagram of a semiconductor device according to a fourth embodiment of the present disclosure.
Figure 22:
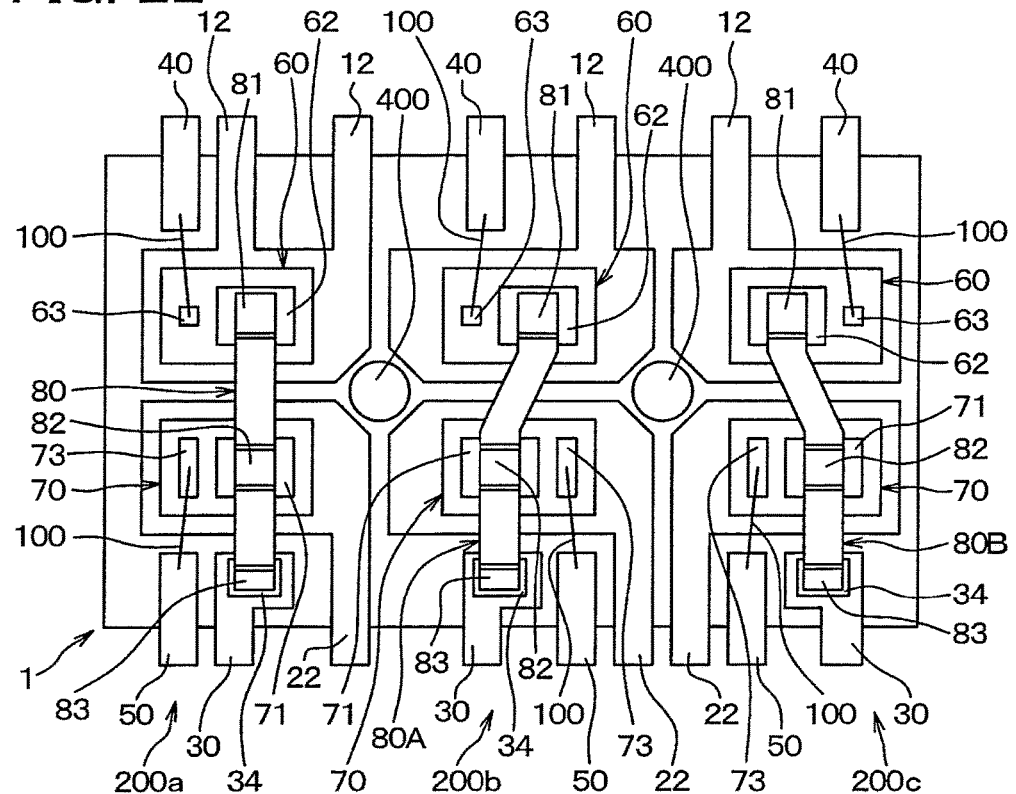
FIG. 22 is a top view of the semiconductor device according to the fourth embodiment.

A semiconductor device 1 according to a fourth embodiment of the present disclosure will be described with reference to FIG. 21 and FIG. 22. In the semiconductor device 1, an inverter circuit 200A is formed using three clips.

The inverter circuit 200A controls a three-phase direct-current motor 300A and includes half bridges 200a, 200b, 200c. Each of the half bridges 200a, 200b, 200c has a configuration similar to the half bridge 200 of the first embodiment. The semiconductor device 1 is formed using the clips 80, 80A, 80B. The semiconductor device 1 according to the present embodiment has two holes 400.

Fifth Embodiment

Figure 23:
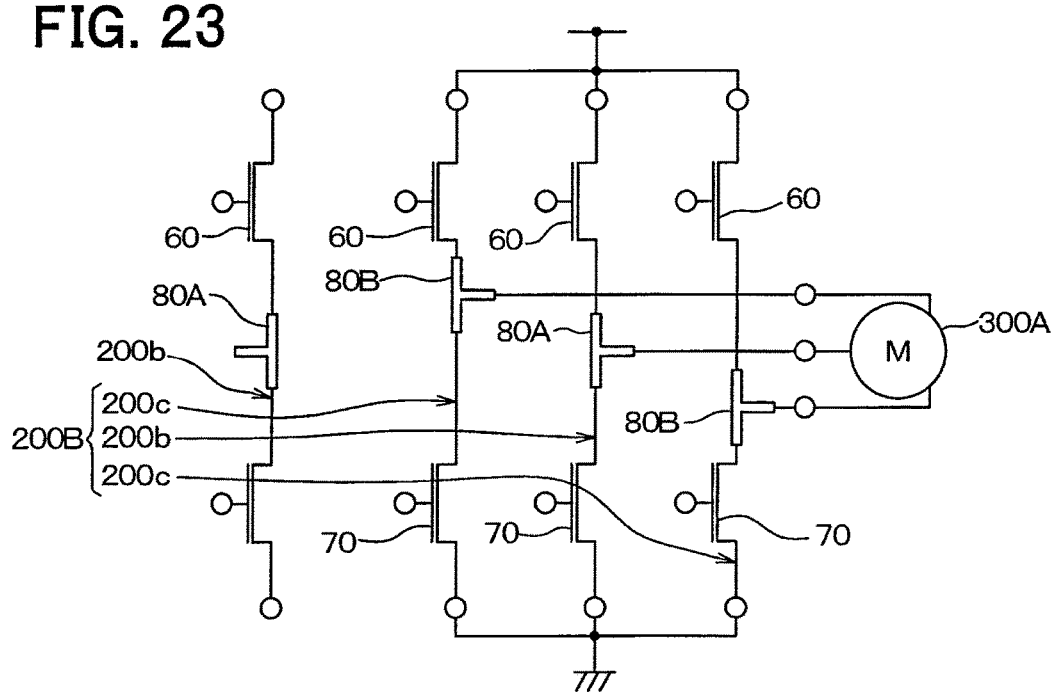
FIG. 23 is a circuit diagram of a semiconductor device according to a fifth embodiment of the present disclosure.
Figure 24:
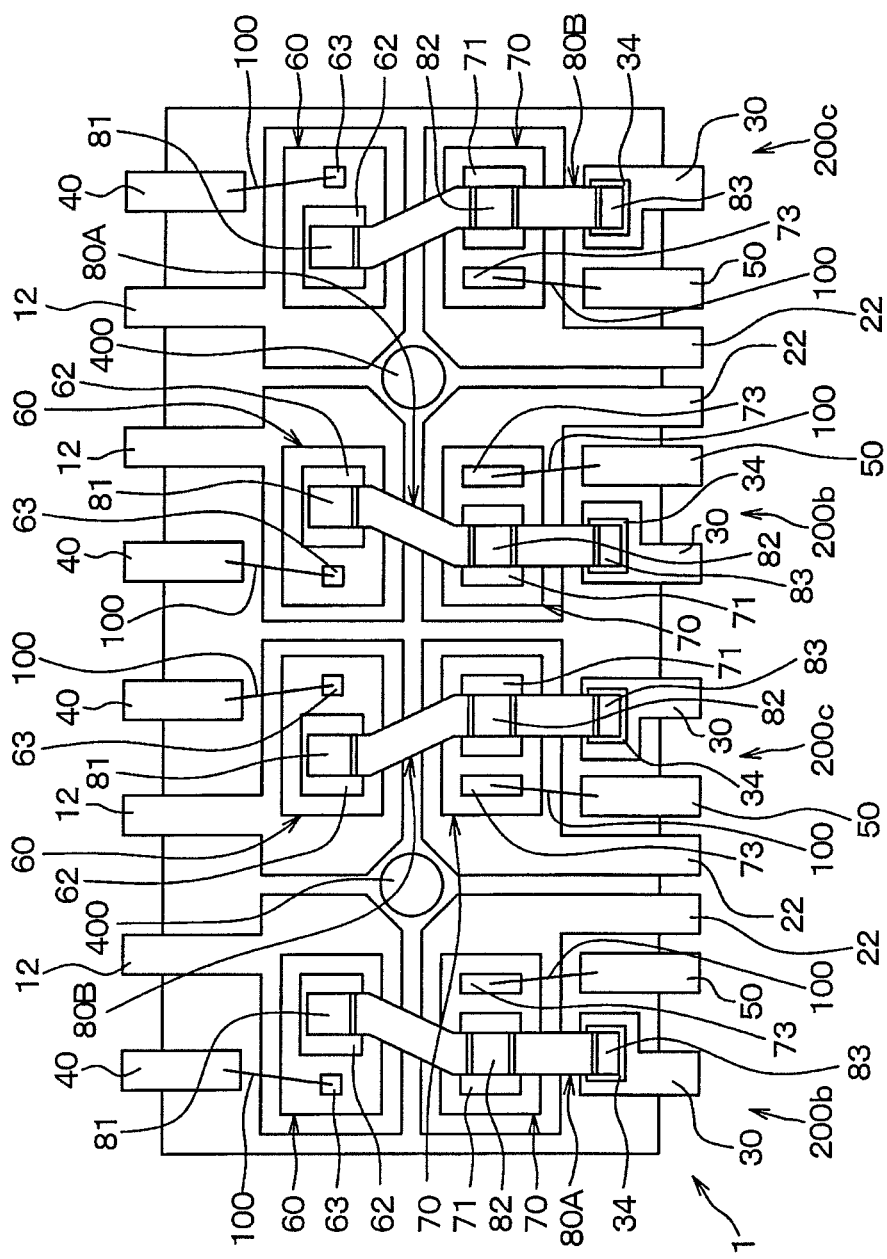
FIG. 24 is a top view of the semiconductor device according to the fifth embodiment.

A semiconductor device 1 according to a fifth embodiment of the present disclosure will be described with reference to FIG. 23 and FIG. 24.

The semiconductor device 1 according to the present embodiment includes one half bridge 200b and an inverter circuit 210B. The inverter circuit 210B includes one half bridge 200b and two half bridges 200c. The half bridge 200b according to the present embodiment is similar to the half bridge 200b according to the fourth embodiment. The half bridges 200c according to the present embodiment are similar to the half bridge 200c according to the fourth embodiment. Thus, the semiconductor device 1 includes two clips 80A and two clips 80B. The semiconductor device 1 according to the present embodiment has two holes 400.

Other Embodiments

In the above-described embodiments, three terminals, that is, the output terminal 62 of the semiconductor switching element 60, the input terminal 71 of the semiconductor switching element 70, and the island 30 are connected to each other with one of the clips 80, 80A, 80B, 80C. In another embodiment, more than three terminals may be connected with one of the clips 80, 80A, 80B, 80C. In this case, the clip includes more than three joint portions.

In the first to fifth embodiments, the terminals include the input terminal and the output terminals of the semiconductor switching elements 60, 70. However, the terminals are not limited to the terminals of the semiconductor switching elements and may be other terminals.

In the first to fifth embodiments, the depressed portion 34 is provided only in the island 30 among the output terminal 62 of the semiconductor switching element 60, the input terminal 71 of the semiconductor switching element 70, and the island 30. In another embodiment, a depressed portion for storing the conductive bonding material may also be provided in one of the output terminal 62 of the semiconductor switching element 60 and the input terminal 71 of the semiconductor switching element 70. In the present case, the variation in heights of the three terminals is absorbed by the conductive bonding material in two of the three terminals.

In the first to fifth embodiments, the electronic devices according to the present embodiment are applied to the semiconductor devices 1. However, the electronic devices according to the present disclosure may also be applied to devices other than the semiconductor devices 1.

The present disclosure is not limited to the above-described embodiments, and the various changes and modifications can be made within the scope of the present disclosure. The first to fifth embodiments are not unrelated to each other and may be combined with each other unless the combination is apparently impossible.

What is claimed is:
1. An electronic device comprising:
first to third terminals; and
a clip including first to third joint portions and a connection portion, the first to third joint portions corresponding to and bonded to the first to third terminals, respectively, the connection portion connecting the first to third joint portions, wherein
one terminal in the first to third terminals has a top surface with a depressed portion depressed to one side in a predetermined direction, the depressed portion including sidewalls extending below the top surface of the one terminal,
one joint portion of the first to third joint portions corresponding to the one terminal is bonded to the one terminal through the conductive bonding material contained in the depressed portion of the one terminal at an adjusted height relative to the one terminal by previously deforming the conductive bonding material and changing a position of the one joint portion within the conductive bonding material relative to the one terminal,
the one joint portion in the first to third joint portions corresponding to the one terminal is located to the one side in the predetermined direction compared with other two joint portions in the first to third joint portions, the first joint portion is located to a first side of the second joint portion in a direction perpendicular to the predetermined direction, the third joint portion is located to a second side of the joint portion in the direction perpendicular to the predetermined direction, the second side is an opposite side from the first side, one of the first joint portion and the third joint portion is the one joint portion corresponding to the one terminal having the depressed portion, the connection portion includes a first connection portion connecting the first and second joint portions and a second connection portion connecting the second and third joint portions, and the clip has a center of gravity in one of the first and second connection portions.

2. The electronic device according to claim 1, wherein the one joint portion is bonded to the one terminal through the conductive bonding material in a state where the one joint portion is away from a depressed-portion forming part defining the depressed portion.

3. The electronic device according to claim 1, further comprising first and second semiconductor switching elements each including an input terminal, an output terminal, and a control terminal controlling a resistance value between the input terminal and the second terminal, wherein the output terminal of the first semiconductor switching element is one of the first to third terminals, and the input terminal of the second semiconductor switching element is another of the first to third terminals.

4. The electronic device according to claim 3, wherein the third terminal is connected to an electric motor.

5. The electronic device according to claim 3, further comprising a sealing resin member made of resin and covering the first to third terminals and the clip.

6. The electronic device according to claim 1, wherein the sidewalls of the depressed portion extend parallel to each other in the predetermined direction.

7. The electronic device according to claim 1, wherein the depressed portion has a depth greater than a thickness of the one joint portion and less than a height of the one terminal, and a bottom of the one joint portion is bonded to the conductive bonding material at a height below the top surface of the one terminal.

8. An electronic device comprising:

first to third terminals; and a clip including first to third joint portions and a connection portion, the first to third joint portions corresponding to and bonded to the first to third terminals, respectively, the connection portion connecting the first to third joint portions, wherein one terminal in the first to third terminals has a top surface and a depressed portion depressed to one side in a predetermined direction, the depressed portion includes sidewalls extending in the predetermined direction and below the top surface of the one terminal, a lower opening portion adjacent a lower side of the depressed portion, an upper opening portion adjacent the top surface of the one terminal, the sidewalls connecting the lower opening portion to the upper opening portion, at least one of the sidewalls has a stepped shape, and an opening area of the upper opening portion is greater than an opening area of the lower opening portion, the depressed portion has a depth and is filled with a conductive bonding material to a height sufficient to absorb a variation in positions of the first to third terminals in the predetermined direction by deformation of the conductive bonding material when one joint portion in the first to third joint portions corresponding to the one terminal is bonded to the one terminal through the conductive bonding material, the one joint portion is bonded to the conductive bonding material contained in the lower opening portion and is free from contact with the sidewalls and the lower side of the depressed portion, and a bottom of the one joint portion extends below a surface of the conductive bonding material.

9. The electronic device according to claim 8, wherein the one joint portion in the first to third joint portions corresponding to the one terminal is located to the one side in the predetermined direction compared with other two joint portions in the first to third joint portions.

10. The electronic device according to claim 9, wherein the first joint portion is located to a first side of the second joint portion in a direction perpendicular to the predetermined direction, the third joint portion is located to a second side of the joint portion in the direction perpendicular to the predetermined direction, the second side is an opposite side from the first side, the connection portion includes a first connection portion connecting the first and second joint portions and a second connection portion connecting the second and third joint portions, and the clip has a center of gravity in one of the first and second connection portions.

11. The electronic device according to claim 8, wherein the depressed portion has a depth greater than a thickness of the one joint portion and less than a height of the one terminal, and a bottom of the one joint portion is bonded to the conductive bonding material at a height below the top surface of the one terminal.

12. An electronic device comprising:

first to third terminals; and a clip including first to third joint portions and a connection portion, the first to third joint portions corresponding to and bonded to the first to third terminals, respectively, the connection portion connecting the first to third joint portions, wherein one terminal in the first to third terminals has a top surface and a depressed portion, the depressed portion extends to one side in a predetermined direction below the top surface of the one terminal, the depressed portion includes inclined sidewalls and provides an opening area in a direction perpendicular to the predetermined direction that increases from a lower side of the depressed portion toward the top of the depressed portion, the depressed portion has a depth and is filled with a conductive bonding material from the lower side of the depressed portion to a height sufficient to absorb a variation in positions of the first to third terminals in the predetermined direction by deformation of the conductive bonding material when one joint portion of the first to third joint portions corresponding to the one terminal is bonded to the one terminal through the conductive bonding material contained in the depressed portion, the one joint portion is bonded to the conductive bonding material contained in the lower side of the depressed portion and is free from contact with the sidewalls and the lower side of the depressed portion, and a bottom of the one joint portion extends below a surface of the conductive bonding material.

13. The electronic device according to claim 12, wherein the one joint portion in the first to third joint portions corresponding to the one terminal is located to the one side in the predetermined direction compared with other two joint portions in the first to third joint portions.

14. The electronic device according to claim 13, wherein the first joint portion is located to a first side of the second joint portion in a direction perpendicular to the predetermined direction, the third joint portion is located to a second side of the joint portion in the direction perpendicular to the predetermined direction, the second side is an opposite side from the first side, the connection portion includes a first connection portion connecting the first and second joint portions and a second connection portion connecting the second and third joint portions, and the clip has a center of gravity in one of the first and second connection portions.

15. The electronic device according to claim 12, wherein the depressed portion has a depth greater than a thickness of the one joint portion and less than a height of the one terminal, and a bottom of the one joint portion is bonded to the conductive bonding material at a height below the top surface of the one terminal.

16. An electronic device comprising:

first, second and third terminals; and a clip including first, second and third joint portions and a connecting portion; the first, second and third joint portions corresponding to and being respectively bonded to the first, second and third terminals; and the connecting portion connecting the first, second and third joint portions together, wherein one terminal of the first, second and third terminals including a top surface and a depressed portion depressed to one side in a predetermined direction, the depressed portion having sidewalls and extending below the top surface of the one terminal and holding a conductive bonding material in both a solidified state and a melted state, a variation in heights of the first, second and third terminals in the predetermined direction is absorbed by deformation of the conductive bonding material and bonding one joint portion of the first, second and third joint portions corresponding to the one terminal through the conductive bonding material contained in the depressed portion of the one terminal and without the one joint portion directly contacting of the sidewalls of the depressed portion, a bottom of the one joint portion extending below a surface of the conductive bonding material, the deformation of the conductive bonding material includes changing a position of the one joint portion within the depressed portion while the conductive material is in the melted state and maintaining the position of the one joint portion and solidifying the conductive material within the depressed portion, the one joint portion in the first to third joint portions corresponding to the one terminal is located to the one side in the predetermined direction compared with other two joint portions in the first to third joint portions, the first joint portion is located to a first side of the second joint portion in a direction perpendicular to the predetermined direction, the third joint portion is located to a second side of the joint portion in the direction perpendicular to the predetermined direction, the second side is an opposite side from the first side, one of the first joint portion and the third joint portion is the one joint portion corresponding to the one terminal having the depressed portion, the connection portion includes a first connection portion connecting the first and second joint portions and a second connection portion connecting the second and third joint portions, and the clip has a center of gravity in one of the first and second connection portions.

17. The electronic device according to claim 16, wherein the depressed portion has sidewalls extending parallel to each other in the predetermined direction.

18. The electronic device according to claim 16, wherein the depressed portion has a depth greater than a thickness of the one joint portion and less than a height of the one terminal, and a bottom of the one joint portion is bonded to the conductive bonding material at a height below the top surface of the one terminal.

* * * * *